(12) United States Patent
Chen et al.

(10) Patent No.: US 12,183,753 B2
(45) Date of Patent: Dec. 31, 2024

(54) IMAGE SENSOR AND METHOD OF MAKING

(71) Applicant: TAIWAN SEMICONDUCTOR MANUFACTURING COMPANY, LTD., Hsinchu (TW)

(72) Inventors: Wei-Lin Chen, Hsinchu (TW); Ching-Chung Su, Hsinchu (TW); Chun-Hao Chou, Hsinchu (TW); Kuo-Cheng Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 589 days.

(21) Appl. No.: 17/483,962

(22) Filed: Sep. 24, 2021

(65) Prior Publication Data

US 2023/0012344 A1 Jan. 12, 2023

Related U.S. Application Data

(60) Provisional application No. 63/219,669, filed on Jul. 8, 2021.

(51) Int. Cl.
*H01L 27/146* (2006.01)
*G02F 1/19* (2019.01)

(52) U.S. Cl.
CPC ......... *H01L 27/14625* (2013.01); *G02F 1/19* (2013.01); *H01L 27/1462* (2013.01); *H01L 27/14621* (2013.01); *H01L 27/14627* (2013.01); *H01L 27/14645* (2013.01); *H01L 27/14685* (2013.01); *H01L 27/14689* (2013.01)

(58) Field of Classification Search
CPC ........... H01L 27/14625; H01L 27/1462; H01L 27/14621; H01L 27/14627; H01L 27/14645; H01L 27/14685; H01L 27/14689; G02F 1/19
USPC ........................................................ 257/432
See application file for complete search history.

(56) References Cited

U.S. PATENT DOCUMENTS

| 6,411,758 | B1 * | 6/2002 | Stankus | ............... G02B 6/4206 385/52 |
| 6,833,601 | B2 * | 12/2004 | Murakami | ........ H01L 31/02327 257/233 |
| 8,049,153 | B2 * | 11/2011 | Tay | ................... H01L 27/14685 250/216 |
| 8,274,122 | B2 * | 9/2012 | Shimotsusa | ......... H01L 27/1462 257/292 |

(Continued)

*Primary Examiner* — Vu A Vu
(74) *Attorney, Agent, or Firm* — Hauptman Ham, LLP

(57) ABSTRACT

An image sensor includes a first photodiode and a second photodiode. The image sensor further includes a first color filter over the first photodiode; and a second color filter over the second photodiode. The image sensor further includes a first microlens over the first color filter and a second microlens over the second color filter. The image sensor further includes a first electro-optical (EO) film between the first color filter and the first microlens, wherein a material of the first EO film is configured to change refractive index in response to application of an electrical field. The image sensor further includes a second EO film between the second color filter and the second microlens, wherein a material of the second EO film is configured to change refractive index in response to application of an electrical field.

20 Claims, 13 Drawing Sheets

(56) References Cited

U.S. PATENT DOCUMENTS

| | | | | |
|---|---|---|---|---|
| 8,917,338 | B2* | 12/2014 | Otsuka | H01L 27/14629 |
| | | | | 257/447 |
| 10,312,280 | B2* | 6/2019 | Lee | H01L 27/14625 |
| 10,763,298 | B2* | 9/2020 | Nishimura | H01L 27/14818 |
| 11,804,504 | B2* | 10/2023 | Seo | H01L 27/1464 |
| 2013/0015545 | A1* | 1/2013 | Toumiya | H01L 27/14605 |
| | | | | 257/E31.127 |
| 2020/0152682 | A1* | 5/2020 | Boriskin | H01L 27/14625 |
| 2022/0415958 | A1* | 12/2022 | Ikehara | G02B 5/22 |

* cited by examiner

IMAGE SENSOR AND METHOD OF MAKING

PRIORITY CLAIM AND CROSS-REFERENCE

The current application claims priority to provisional application 63/219,669 filed Jul. 8, 2021, the entire contents of which are incorporated herein by reference in their entirety.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor has a high image acquisition rate, a lower operating voltage, lower power consumption and higher noise immunity. In addition, CMOS image sensors are able to be fabricated on the same high volume wafer processing lines as logic and memory devices. As a result, a CMOS image chip is able to include both image sensors and any related logic, such as amplifiers, A/D converters, or the like.

CMOS image sensors generally are pixelated metal oxide semiconductors. A CMOS image sensor includes an array of light sensitive picture elements (pixels), each of which includes transistors, capacitors, and a photo-sensitive element. A CMOS image sensor utilizes light-sensitive CMOS circuitry to convert photons into electrons. The light-sensitive CMOS circuitry typically comprises a photodiode formed in a substrate. As the photodiode is exposed to light, electrical charges are induced in the photodiode. Each pixel generates electrons proportional to the amount of light that reaches the pixel when light is incident on the pixel from a subject scene. Furthermore, the electrons are converted into a voltage signal in the pixel and further transformed into a digital signal by means of an A/D converter. Periphery circuits receive the digital signals and process the signals to display an image of the subject scene.

In some instances, a CMOS image sensor includes additional layers, such as dielectric layers and interconnect metal layers, on the substrate, wherein the interconnect layers couple the photodiode with peripheral circuitry. The side having additional layers of the CMOS image sensor is commonly referred to as a front side, while the side having the substrate is referred to as a backside. CMOS image sensors are divided into two major categories based on the side in which the light is incident, namely front side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
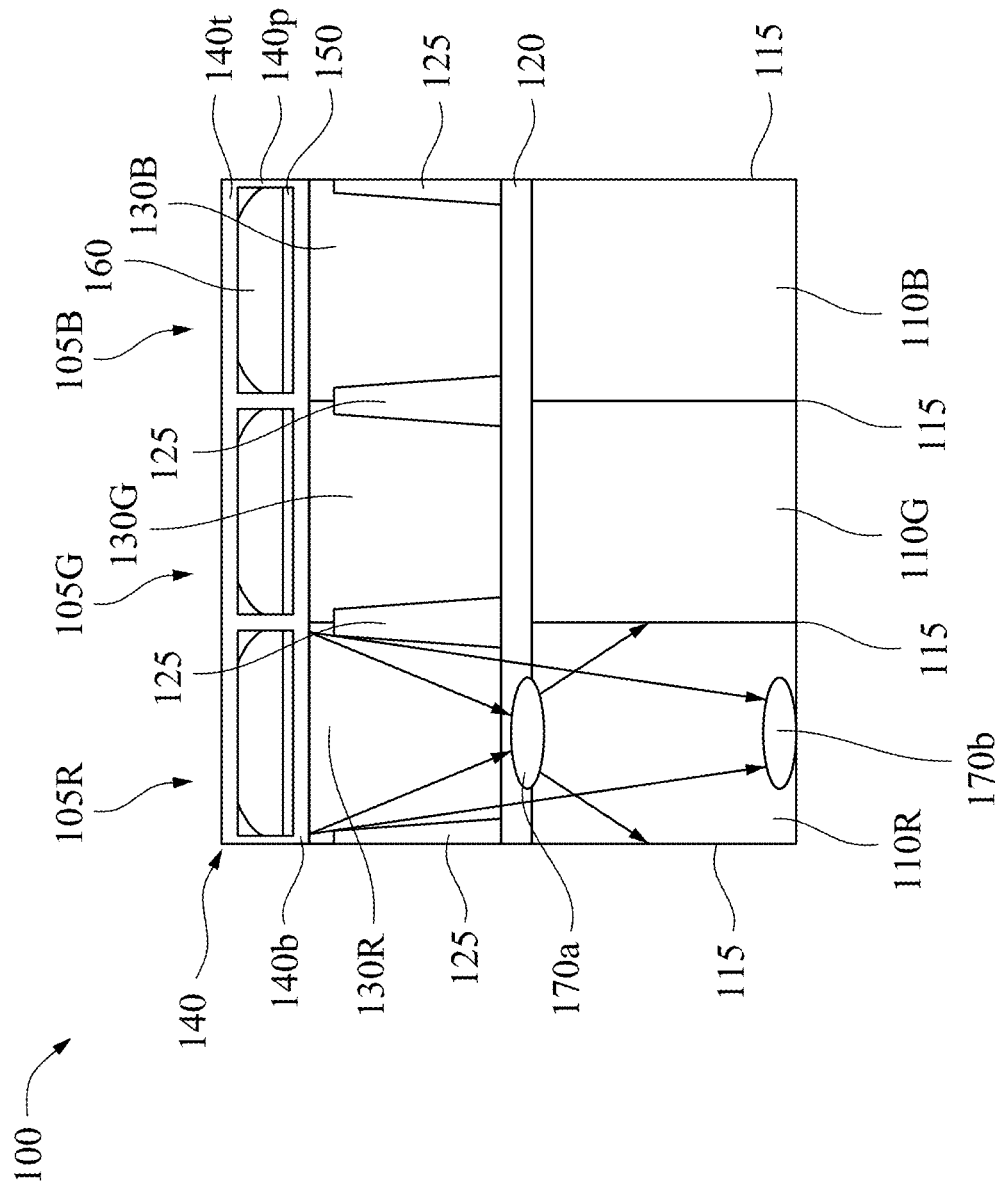
FIG. 1 is a cross-sectional view of an image sensor in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Quantum efficiency (QE) is a measure of how efficient an image sensor is at converting incident light to electrical signals. In other approaches, microlenses are used to focus incident light on a corresponding photodiode. Dimensions of the microlenses, such as radius of curvature, and alignment of the microlenses on the image sensor significantly impact the QE. Improper dimensions, for example, from manufacturing error, or misalignment often cause the focal location of the incident light to be in a location that results in reduced QE in comparison with a designed QE. In some instances, improper dimensions or misalignment result in crosstalk where light intended to be detected in a certain pixel is actually detected in an adjacent pixel. Such crosstalk reduces image accuracy and precision.

In order to reduce the effects of improper dimensions or misalignment, the current description includes an electro-optical (EO) film. The EO film has optical properties, such as a refractive index, that are adjustable based on an applied electrical field. By changing the optical properties of the EO film, the improper dimensions or misalignment are able to be accounted for by adjusting a path of the light propagating toward the photodiode. Refracting of light incident on the EO film is based on a refractive index difference between the material that the light passes through prior to entering the EO film. Adjusting the refractive index of the EO film will permit tuning of the light propagation direction into the photodiode and improve QE.

Further, different colors of light have different absorption depths. For example, red light, having a wavelength of about 600 nanometers (nm), has an absorption depth of about 2.42 microns (μm); green light, having a wavelength of about 500 nm, has an absorption depth of about 0.9 μm; and blue light, having a wavelength of about 450 nm, has an absorption depth of about 0.39 μm. Microlenses that have the same dimensions focus most incident light at a substantially equal focal point location. Including the EO film will permit tuning of focal point locations for pixels configured to detect different wavelengths of light.

FIG. 1 is a cross-sectional view of an image sensor 100 in accordance with some embodiments. The image sensor 100 includes a first pixel 105R for detecting red light, a second pixel 105G for detecting green light, and a third pixel 105B for detecting blue light. Collectively, the first pixel 105R, the second pixel 105G and the third pixel 105B are referred to as pixels 105. The image sensor 100 includes a first photodiode (PD) 110R configured to receive red light, a second PD 110G configured to receive green light, and a third PD 110B configured to receive blue light. Collectively, the first PD 110R, the second PD 110G and the third PD 110B are called photodiodes 110. The image sensor 100 further includes a first isolating material 115 between adjacent photodiodes 110. An anti-reflective coating (ARC) 120 is over the photodiodes 110 and the first isolating material 115. A second isolating material 125 is over the ARC 120. A first color filter 130R is over the first PD 110R and is configured to filter incident light to allow only red light to pass. A second color filter 130G is over the second PD 110G and is configured to filter incident light to allow only green light to pass. A third color filter 130B is over the third PD 110B and is configured to filter incident light to allow only blue light to pass. Collectively, the first color filter 130R, the second color filter 130G, and the third color filter 130B are called color filters 130. The second isolating material 125 is between adjacent color filters 130. A bottom layer of transparent conductive material 140b is over the color filters 130. An EO film 150 is over the bottom layer of transparent conductive material 140b. An array of microlenses 160 is over the EO film 150. Each microlens of the array of microlenses 160 is aligned with a corresponding color filter of the color filters 130 and a photodiode of the photodiodes 110. A top layer of transparent conductive material 140t is over the array of microlenses 160. Pillars of transparent conductive material 140p electrically connects the top layer of transparent conductive material 140t with the bottom layer of transparent conductive material 140b. The pillars of transparent conductive material 140p are between adjacent microlenses of the array of microlenses 160.

By adjusting an electrical field applied to the EO film 150, a focal point location of light in each of the photodiodes 110 is adjustable. For example, at a first electrical field setting, the EO film 150 associated with the first pixel 105R helps to focus the incident light at a first focal point location 170a; and at a second electrical field setting, the EO film 150 helps to focus the incident light at a second foal point location 170b farther into the first PD 110R.

The photodiodes 110 are configured to receive light and convert the light into electrical signals usable by logic circuits connected to the photodiodes 110. Additional details of a structure of the photodiodes 110, in some embodiments, is described below with respect to FIG. 4.

The first isolating material 115 is configured to electrically and optically separate the photodiodes 110 from one another. In some embodiments, the first isolating material 115 includes a dielectric material. In some embodiments, the first isolating material 115 includes doped regions. In some embodiments, the first isolating material 115 includes both a dielectric material and doped regions. In some embodiments, the doped regions include p-type dopants. Additional details of the first isolating material 115, in some embodiments, are discussed below with respect to FIG. 4.

The ARC 120 is configured to reduce reflecting of incident light at an interface of the color filters 130 and the photodiodes 110. In some embodiments, the ARC 120 includes a low refractive index material. In some embodiments, the ARC 120 includes a multi-layered structure. In some embodiments, the ARC 120 includes a three-layered structure, although fewer or more layers are used in some embodiments. In some embodiments, the ARC 120 includes a silicon oxide layer, a hafnium oxide ($HfO_2$) layer over the silicon oxide layer, and a tantalum oxide ($Ta_2O_5$) layer over the hafnium oxide layer. These layers may be formed by any acceptable process, such as CVD or the like. In some embodiments, the silicon oxide layer has a thickness greater than about 0 angstroms (Å) up to about 100 Å, such as 20 Å; the hafnium oxide layer has a thickness ranging from about 30 Å to about 150 Å, such as 60 Å; and the tantalum oxide layer has a thickness ranging from about 300 Å to about 800 Å, such as 500 Å. If the thickness of any of the layers of the ARC 120 is too great, absorption of the incident light is increased and less light is able to propagate to the corresponding photodiode 110, in some instances. If the thickness of any of the layers of the ARC 120 is too small, a risk of reflecting an increased portion of the incident light increases so less light is able to propagate to the corresponding photodiode 110, in some instances.

The second isolating material 125 is configured to optically separate the color filters 130 from one another. The second isolating material 125 does not extend to the top of the color filters 130 in order to try to collect as much light as possible to be passed through to the corresponding photodiode 110. In some embodiments, the second isolating material 125 has a top surface substantially co-planar with a top surface of the color filters 130. In some embodiments, the second isolating material includes silicon oxide, silicon nitride or another suitable material. In some embodiments, the second isolating material 125 is formed by a deposition process, such as plasma enhanced CVD (PECVD). In some embodiments, an etching process is used to define a shape of the second isolating material 125. In some embodiments, a thickness of the second isolating material 125 ranges from about 3,000 Å to about 15,000 Å, such as 8,000 Å. If a thickness of the second isolating material 125 is too large, the thickness of the color filters 130 will also increase resulting in more light absorbed by the color filters 130, in some instances. If a thickness of the second isolating material 125 is too small, then a risk of crosstalk, i.e., light leaking from one color filter 130 to an adjacent color filter 130, increases, in some instances.

The color filters 130 are configured to permit only a designed wavelength of light through to the corresponding photodiode 110. In some embodiments, the color filters 130 are reflective color filters, i.e., the color filters 130 reflect light other than the designed wavelength. In some embodiments, the color filters 130 are absorptive color filters, i.e., the color filters 130 absorb light other than the designed wavelength. In some embodiments, the color filters 130 include red, green, or blue color filters. In some embodiments, the color filters include other colors, such as cyan, yellow, or magenta. In some embodiments, the color filters 130 include a polymeric material or resin, such as a polymeric polymer, polymethyl-methacrylate (PMMA), polyglycidylmethacrylate (PGMS), or the like, that includes colored pigments. In some embodiments, a polymeric polymer material with a first color pigment, e.g., a red pigment, is formed using a process such as spin coating or the like. The polymeric polymer material with the first color pigment is removable by a suitable photolithographic masking and etching process. For example, in some embodiments, a photoresist is patterned to cover the desired portions of the polymeric polymer material with the first color pigment, and the exposed portions of the polymeric polymer material with the first color pigment is removed using an anisotropic etch. Sequential deposition and removal of select color filters 130 permits the formation of the color filters 130 in a desired arrangement. In some embodiments, the color filters 130 are arranged in a Bayer pattern. Excess polymeric polymer material is removable using a planarization process, such as a CMP or the like.

The bottom layer of transparent conductive material 140b is configured to electrically connect to the EO film 150 for a corresponding pixel in order to adjust the electrical field applied to the EO film 150. The bottom layer of transparent conductive film 140b is transparent to allow light to pass through and is conductive to function as an electrode. Examples of suitable materials for bottom layer of transparent conductive material 140b include, but are not limited to, indium tin oxide (ITO), indium zinc oxide (IZO), indium gallium zinc oxide (IGZO), and the like. In some embodiments, the bottom layer of transparent conductive material 140b is deposited by physical vapor deposition (PVD). However, other deposition processes, such as chemical vapor deposition (CVD) or atomic layer deposition (ALD), or other applicable processes, are possible. In some embodiments, a thickness of the bottom layer of transparent conductive material 140b ranges from about 50 nm to about 300 nm. If a thickness of the bottom layer of transparent conductive material 140b is too large, then more light is absorbed while passing through the bottom layer of transparent conductive material 140b, in some instances. If the thickness of the bottom layer of transparent conductive material 140b is too small, then a resistance within the layer increases to an unacceptable level, in some instances. In some embodiments, a work function of the bottom layer of transparent conductive material 140b ranges from about 4.5 eV to about 5.5 eV. The work function is tunable based on the material and by varying the thickness.

The bottom layer of transparent conductive material 140b is a continuous layer in the image sensor 100. In some embodiments, the bottom layer of transparent conductive material 140b is discontinuous and each pixel of the image sensor 100 includes a corresponding bottom layer of transparent conductive material 140b. In some embodiments, the bottom layer of transparent conductive material 140b surrounds the EO film 150 associated with each pixel in order to increase efficiency in the transfer of an electrical field to the EO film 150.

The EO film 150 is configured to adjust optical properties, such as refractive index, in response to application of an electrical field to the EO film 150. The EO film 150 is between the microlens 160 associated with each pixel and the corresponding photodiode 110. The EO film 150 in combination with the microlens 160 helps to determine the location of the focal point in the corresponding photodiode 110. By setting the location of the focal point to a junction, such as a p-n junction, of the photodiode 110, the QE of the image sensor 100 is increased in comparison with other approaches that do not include the EO film 150.

In some embodiments, the EO film 150 is formed using PVD, CVD, ALD or another suitable formation process. In some embodiments, a combination of lithography and etching processes are performed on the EO film 150 in order to physically separate the EO film 150 for each pixel from the EO film 150 associated with adjacent pixels. The removal of the EO film 150 extending between pixels also provides a location for the formation of the pillars of transparent conductive material 140p.

A material of the EO film 150 is selected based on an anticipated power consumption tolerance of the image sensor 100. A change in the refractive index of the EO film 150 based on the application of an electrical field is determined by the Pockels effect. The Pockels effect determines the refractive index of the material based on a refractive index of the material with no electrical field applied, a Pockels coefficient of the material and an applied electrical field. As the Pockels coefficient of a material increases, an effect of a change in the refractive index due to an applied electrical field also increases. In a situation where power consumption is a concern, for example, in a mobile terminal, a drone, or another portable device, selecting a material with a high Pockels coefficient will help to enhance the effect on the refractive index with a smaller electrical field applied. In contrast, in a situation where power consumption is less of a concern, for example, in a security camera connected to a power supply of a building, a material that is less expensive or easier to manufacture but has a lower Pockels coefficient is usable. In some embodiments, the EO film 150 includes at least one of gallium arsenide (GaAs), strained silicon (Si), cadmium telluride (CdTe), zinc oxide (ZnO), potassium dihydrogen phosphate (KDP), lanthanum tantalate ($LaTaO_3$), lithium niobate ($LiNbO_3$), lead zirconate titanate (PZT), barium titanate ($BaTiO_3$), strontium titanate ($SrTiO_3$), strontium barium niobate ($Sr_xBa_yNb_2O_6$), potassium niobate ($KNbO_3$), lead lanthanum zirconate titanate (PLZT), barium titanate ($BaTiO_3$), potassium titanate niobate (KTN), polymers or another suitable material. In some embodiments, a material having a Pockels coefficient greater than $10^2$ pm/V is considered a high Pockels coefficient material. In some embodiments, a thickness of the EO film 150 ranges from about 0.5 µm to about 1 µm. If a thickness of the EO film 150 is too large, too much light is absorbed while passing through the EO film 150, in some instances. If the thickness of the EO film 150 is too small, an effect on refracting the light incident on the EO film 150 is insufficient to achieve adjusting of the focal point location, in some instances.

The microlenses 160 focus incident light for each pixel. The microlenses 160 are intended to be aligned with a corresponding photodiode 110 of each pixel in order to maximize an amount of light captured by each photodiode 110. In some embodiments, the microlenses 160 include a high transmittance, acrylic polymer. In some embodiments, the microlenses 160 are formed using a material in a liquid state and spin-on techniques. In some embodiments, the microlenses 160 are formed using deposition techniques like CVD, PVD, or the like.

The pillars of transparent conductive material 140p are between adjacent microlenses 160 and EO film 150 and electrically connect to the bottom layer of transparent conductive material 140b. The pillars of transparent conductive material 140p electrically connect the bottom layer of transparent conductive material 140b to the top layer of transparent conductive material 140t. In some embodiments, the pillars of transparent conductive material 140p include a same material as the bottom layer of transparent conductive material 140b. In some embodiments, the pillars of transparent conductive material 140p include a different material form the bottom layer of transparent conductive material 140b.

The top layer of transparent conductive material 140t extends over the microlenses 160. The top layer of transparent conductive material 140t is configured to receive a voltage from a controller and transfer the voltage to the bottom layer of transparent conductive material 140b through the pillars of transparent conductive material 140p. In some embodiments, a material of the top layer of transparent conductive material 140t is a same material as both the pillars of transparent conductive material 140p and the bottom layer of transparent conductive material 140b. In some embodiments, a material of the top layer of transparent conductive material 140t is different from at least one of the pillars of transparent conductive material 140p or the bottom layer of transparent conductive material 140b. In some embodiments, a thickness of the top layer of transparent conductive material 140t ranges from about 100 nm to about 1,000 nm. If a thickness of the top layer of transparent conductive material 140t is too large, then too much light is absorbed by the top layer of transparent conductive material 140t, in some instances. If a thickness of the top layer of transparent conductive material 140t is too small, then a resistance of the top layer of transparent conductive material 140t is increased to an unsatisfactory level, in some instances. In some embodiments, a thickness of the top layer of transparent conductive material 140t is a same thickness as the bottom layer of transparent conductive material 140b. In some embodiments, a thickness of the top layer of transparent conductive material 140t is different from a thickness of the bottom layer of transparent conductive material 140b.

In some embodiments, the top layer of transparent conductive material 140t is patterned in order to associate individual portions of the top layer of transparent conductive material 140t with each pixel of the image sensor 100. In some embodiments, the patterning is performed using a combination of lithography and etching processes. By patterning the top layer of transparent conductive material 140t, control over the electrical field applied to the EO film 150 for each pixel of the image sensor 100 is possible.

In operation, the image sensor 100 is configured to receive a voltage at the top layer of conductive transparent material 140t. This voltage is then transferred to the bottom layer of transparent conductive material 140b through the pillars of transparent conductive material 140p in order to generate an electrical field applied to the EO film 150. The electrical field changes a refractive index of the EO film 150 based on the Pockels effect. Light incident on the image sensor 100 passes through the top layer of transparent conductive material 140t to the microlenses 160. The microlenses 160 focus the incident light toward the EO film 150. The EO film 150 refracts the light from the microlenses 160 toward a focal point location based on the electrical field applied to the EO film 150. The first focal point location 170a is a location where the incident light is focused in response to a first electrical field applied to the EO film 150. The second focal point location 170b is a location where the incident light is focused in response to a second electrical filed, different from the first electrical field, applied to the EO film 150. By using the EO film 150 to adjust the focal point location of the incident light, QE is improved to greater than 40% and crosstalk is reduced in comparison with other approaches that do not include the EO film 150.

Figure 2:
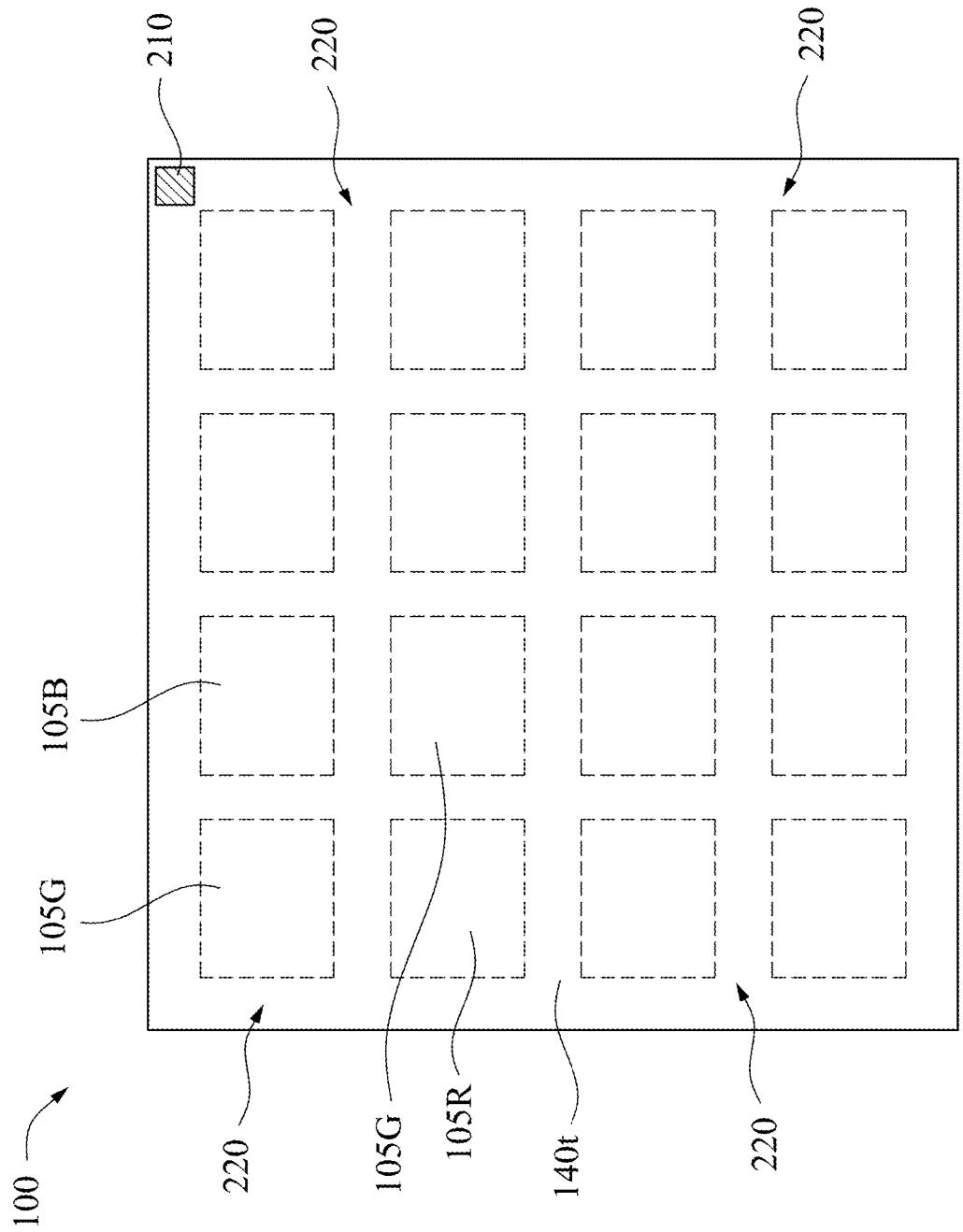
FIG. 2 is a top view of an image sensor in accordance with some embodiments.

FIG. 2 is a top view of the image sensor 100 in accordance with some embodiments. The image sensor 100 includes the top layer of the transparent conductive material 140t extending across an entirety of the image sensor 100. A contact 210 is electrically connected to the top layer of transparent conductive material 140t in order to supply a voltage to the top layer of transparent conductive material 140t from a controller (not shown). A first pixel 105R, a plurality of second pixels 105G and a third pixel 105B are arranged in a top left corner of the image sensor 100. This four-pixel arrangement 220 is repeated across the image sensor 100. In some embodiments, a different pattern of pixels is used in the image sensor 100.

The contact 210 includes a conductive material, such as copper, aluminum, tungsten, cobalt, or another suitable conductive material. In some embodiments, the contact 210 is part of an interconnect structure. The contact 210 is positioned outside of any of the pixels in order to minimize or avoid blocking light from entering the pixels. The image sensor 100 includes a single contact 210. In some embodiments, multiple contacts 210 are spread across the image sensor 100 in order to increase uniformity of electrical fields applied to EO films 150 of the various pixels. The contact 210 is located at a periphery of the pixels of the image sensor 100. In some embodiments, at least one contact 210 is between adjacent pixels of the image sensor 100.

Figure 3:
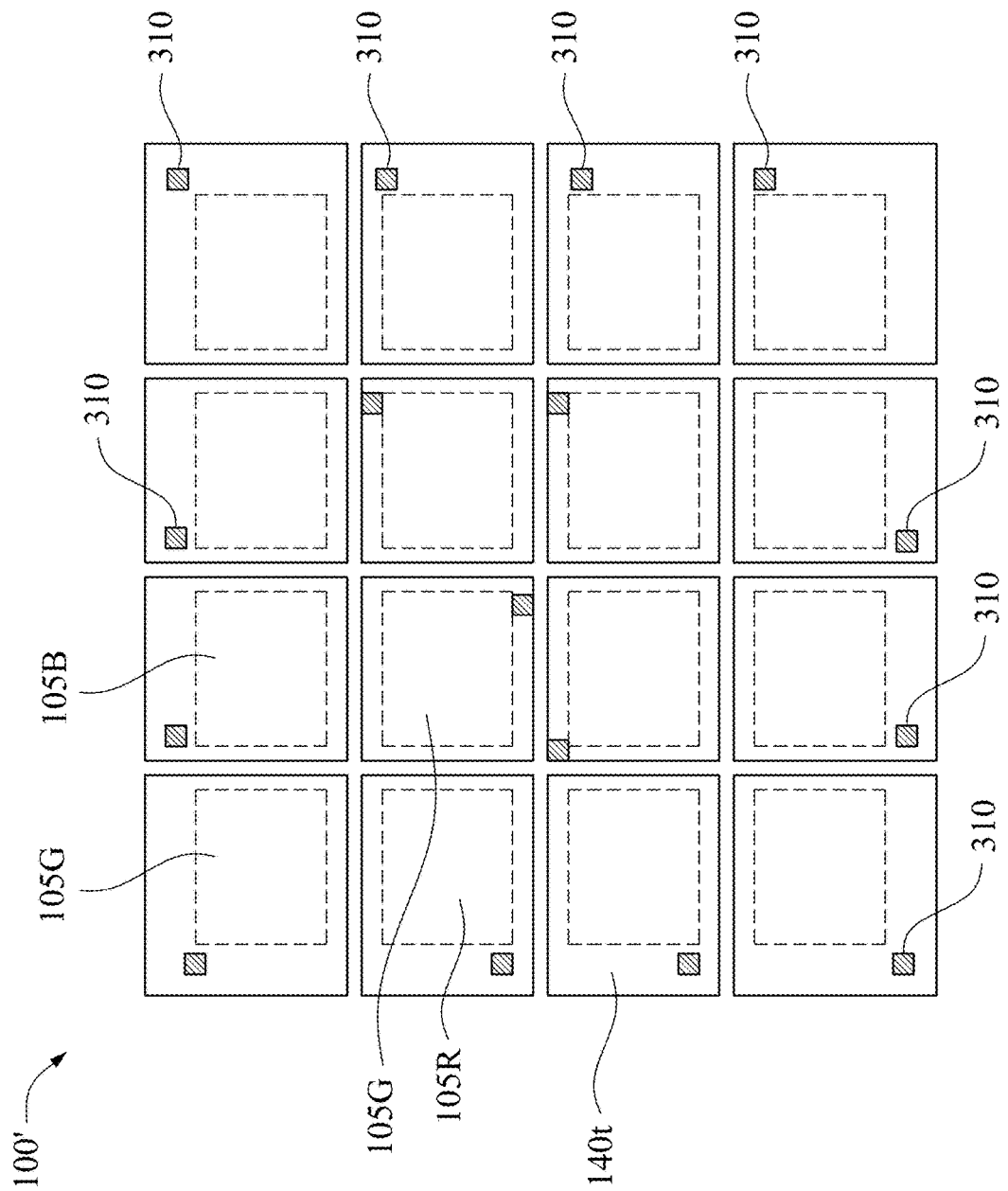
FIG. 3 is a top view of an image sensor in accordance with some embodiments.

FIG. 3 is a top view of an image sensor 100' in accordance with some embodiments. The image sensor 100' includes similar elements as the image sensor 100. In comparison with the image sensor 100, the image sensor 100' includes the top layer of the transparent conductive material 140t separated into different portions. A plurality of contacts 310 is electrically connected to corresponding portions of the top layer of transparent conductive material 140t in order to supply a voltage to the top layer of transparent conductive material 140t from a controller (not shown).

Each of the plurality of contacts 310 includes a conductive material, such as copper, aluminum, tungsten, cobalt, or another suitable conductive material. In some embodiments, the at least one of the plurality of contacts 310 is part of an interconnect structure. Each of the plurality of contacts 310 is positioned outside of any of the pixels in order to minimize or avoid blocking light from entering the pixels. The image sensor 100' includes a 1:1 relationship between pixels and contacts 310. In some embodiments, multiple contacts 310 are associated with at least one pixel of the image sensor 100' in order to increase uniformity of electrical fields applied to EO films 150 of the at least one pixel.

By separating the top layer of transparent conductive material 140t into different portions associated with individual pixels of the image sensor 100', control of the EO film 150 for individual pixels is possible. In contrast, the electrical filed applied to the EO film 150 for the image sensor 100 (FIG. 2) is substantially uniform for all pixels.

Figure 4:
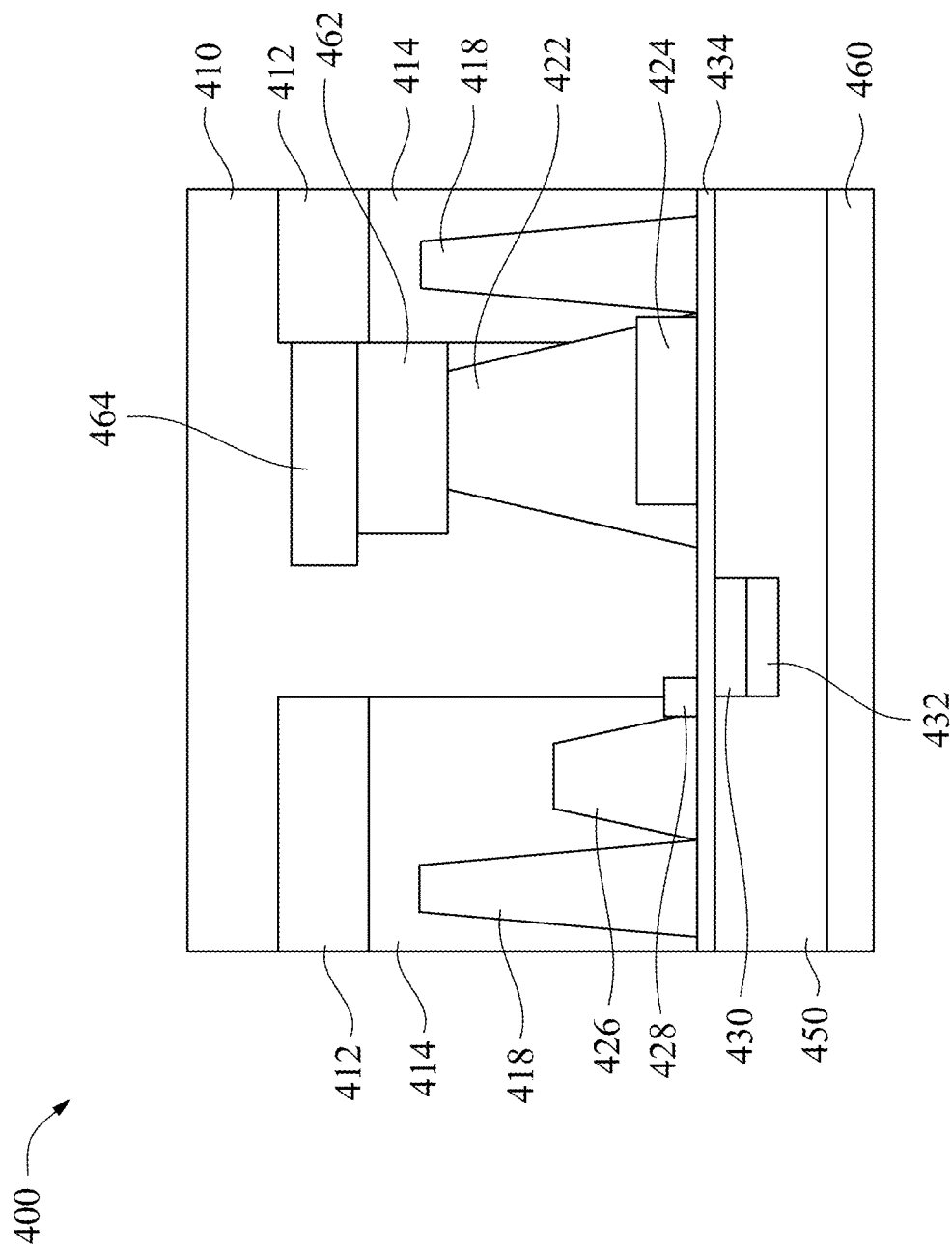
FIG. 4 is a cross-sectional view of a photodiode in accordance with some embodiments.

FIG. 4 is a cross-sectional view of a photodiode 400 in accordance with some embodiments. In some embodiments, the photodiode 400 is usable as any of the photodiodes 110 of the image sensor 100 (FIGS. 1 and 2) or the image sensor 100' (FIG. 3).

A substrate 410 includes a lightly p-type doped epitaxial layer over a highly p-type doped silicon substrate, for example. In some embodiments, the substrate 410 includes silicon, germanium, silicon germanium, graded silicon germanium, carbon, quartz, sapphire, glass, a bulk semiconductor material, a semiconductor-on-insulator, or the like, and may be multi-layered (e.g., comprising strained layers) and/or doped such as by an n-type dopant.

A deep p-well (DPW) region 412 is formed in the substrate 10, and a cell p-well (CPW) region 412 is adjacent to the DPW region 414 in the substrate 410. The DPW region 412 and the CPW region 414 are components of an isolation region formed in the substrate 410 to reduce or prevent crosstalk between adjacent pixels. The DPW region 412 and CPW region 414 are formed by, for example, implanting p-type dopants, such as boron or the like, into the substrate 410. In some embodiments, a p-type doping concentration of the CPW region 414 is greater than a p-type doping concentration of the DPW region 412. In some embodiments, the DPW region 412 has a doping concentration in a range from about $10^{13}/cm^3$ to about $10^{18}/cm^3$. If the dopant concentration of the DPW region 412 is too high a risk of current leakage increases, in some instances. If the dopant concentration of the DPW region 412 is too small the DPW region 412 will provide insufficient isolation, in some instances. In some embodiments, the CPW region 414 has a doping concentration in a range from about $10^{15}/cm^3$ to about $10^{19}/cm^3$. If the dopant concentration of the CPW region 414 is too high a risk of current leakage increases, in some instances. If the dopant concentration of the CPW region 414 is too small the CPW region 414 will provide insufficient isolation, in some instances.

A dielectric material 418, such as an oxide, is deposited in a trench etched into the CPW region 414. In some embodiments, the dielectric material 418 is deposited by a high-density plasma chemical vapor deposition (HDP-CVD), plasma enhanced chemical vapor deposition (PECVD), a thermal CVD, the like, or a combination thereof. Further, the dielectric material 418 is any dielectric material formed by an acceptable process. A planarization, such as by a chemical mechanical polish (CMP), is usable after the deposition of the dielectric material 418.

The photodiode 400 includes an n-type region 422 and a p-type region 424 that form a p-n junction. The n-type region 422 has an n-type dopant concentration, for example, ranging from about $10^{15}/cm^3$ to about $10^{19}/cm^3$, and the p-type region 424 has a p-type dopant concentration, for example, ranging from about $10^{16}/cm^3$ to about $10^{20}/cm^3$. If the dopant concentration of the n-type region 422 or the p-type region 424 is too high, a width of the depletion region at the interface of the n-type region 422 and the p-type region 424 is reduced, in some instances. If the dopant concentration of the n-type region 422 or the p-type region 424 is too low, then a number of mobile charge carriers is reduced, in some instances.

A source/drain region 426 is in the substrate 410 in the CPW region 414. The source/drain region 426 is an n-type region having an n-type dopant concentration of, for example, between about $10^{16}/cm^3$ and about $10^{20}/cm^3$. If a dopant concentration of the source/drain region 426 is too large, then a risk of leakage current increases, in some embodiments. If a dopant concentration of the source/drain region 426 is too low, then a resistance of the source/drain region 426 increases, in some instances. In some embodiments, the source/drain region 426 is a p-type region having a p-type dopant.

An extension region 428 extends from the source/drain region 426, and has an n-type dopant concentration, for example, ranging from about $10^{18}/cm^3$ and about $10^{22}/cm^3$. If a dopant concentration of the extension region 428 is too large, then a risk of shorting between the extension region 428 and the n-type region 422 increases, in some embodiments. If a dopant concentration of the extension region 428 is too low, then a resistance of the extension region 428 increases, in some instances. The regions 422-428 are formable by implantation.

A gate dielectric layer 434 extends across the substrate 410. A gate electrode 430, such as polysilicon or the like, is separated from the extension region 428 by the gate dielectric layer 434. The gate electrode 430 includes an n-type doped upper region 432. In some embodiments, the upper region 432 is formed by implantation, in situ doping during deposition, or the like. In some embodiments, the upper region 432 has an n-type dopant concentration, for example, ranging from about $10^7/cm^3$ and about $10^{14}/cm^3$. If a dopant concentration of the upper region 432 is too large, then a risk of dopants diffusing into surrounding insulating material increases, in some embodiments. If a dopant concentration of the upper region 432 is too low, then a resistance of the upper region 432 increases, in some instances. The gate electrode 430 is laterally between the p-n junction of the n-type region 422 and the p-type region 424 and the source/drain region 426, and partially over the extension region 428.

In some embodiments, a dielectric layer, such as tetraethyl orthosilicate (TEOS) or the like, is conformally over the gate electrode 430, and a resist protective layer (RPL), such as silicon oxide or the like, is conformally over the dielectric layer. In some embodiments, an etch stop layer (ESL), such as silicon nitride or the like, is conformally over the RPL.

An inter-layer dielectric (ILD) 450, such as silicon oxide, borophosphosilicate glass (BPSG), phosphosilicate glass (PSG), fluorinated silicate glass (FSG), carbon-doped silicon oxide, or the like, surrounds the gate electrode 430. In some embodiments, the ILD 450 is planarized using, for example, a CMP.

The photodiode includes contacts (not shown) through the ILD 450 to electrically connect to the gate electrode 430 and the source/drain region 426. For example, openings can be etched using acceptable photolithography and etching techniques, and conductive materials, such as a copper, aluminum, or the like, with or without a barrier layer, are deposited into the openings. A polishing and/or grinding process, such as a CMP, is usable to remove excess conductive materials and leave the contacts in the openings.

An interconnect structure 460 is electrically connects the components of the photodiode to other elements of an image sensor. The interconnect structure 460 includes inter-metal dielectrics (IMDs) having metallization patterns therein. In some embodiments, each of the IMDs, independently, includes silicon oxide, BPSG, PSG, FSG, the like, or a combination thereof, formed by CVD, HDP-CVD, furnace deposition, PECVD, the like, or a combination thereof. The metallization patterns in each of the IMDs are formed using, for example, a damascene process like a dual damascene. Conductive materials, such as aluminum, copper, or the like, with or without a barrier layer, are usable as the metallization patterns. In some embodiments, the metallization patterns are deposited using, for example, CVD, atomic layer deposition (ALD), physical vapor deposition (PVD), the like, or a combination thereof. A polishing and/or grinding process, such as a CMP, is used to remove excess conductive materials. The interconnect structure 460 further includes passivation layers including, for example, silicon nitride, silicon carbide, silicon oxide, the like, or a combination thereof, deposited by CVD or the like.

Figure 5:
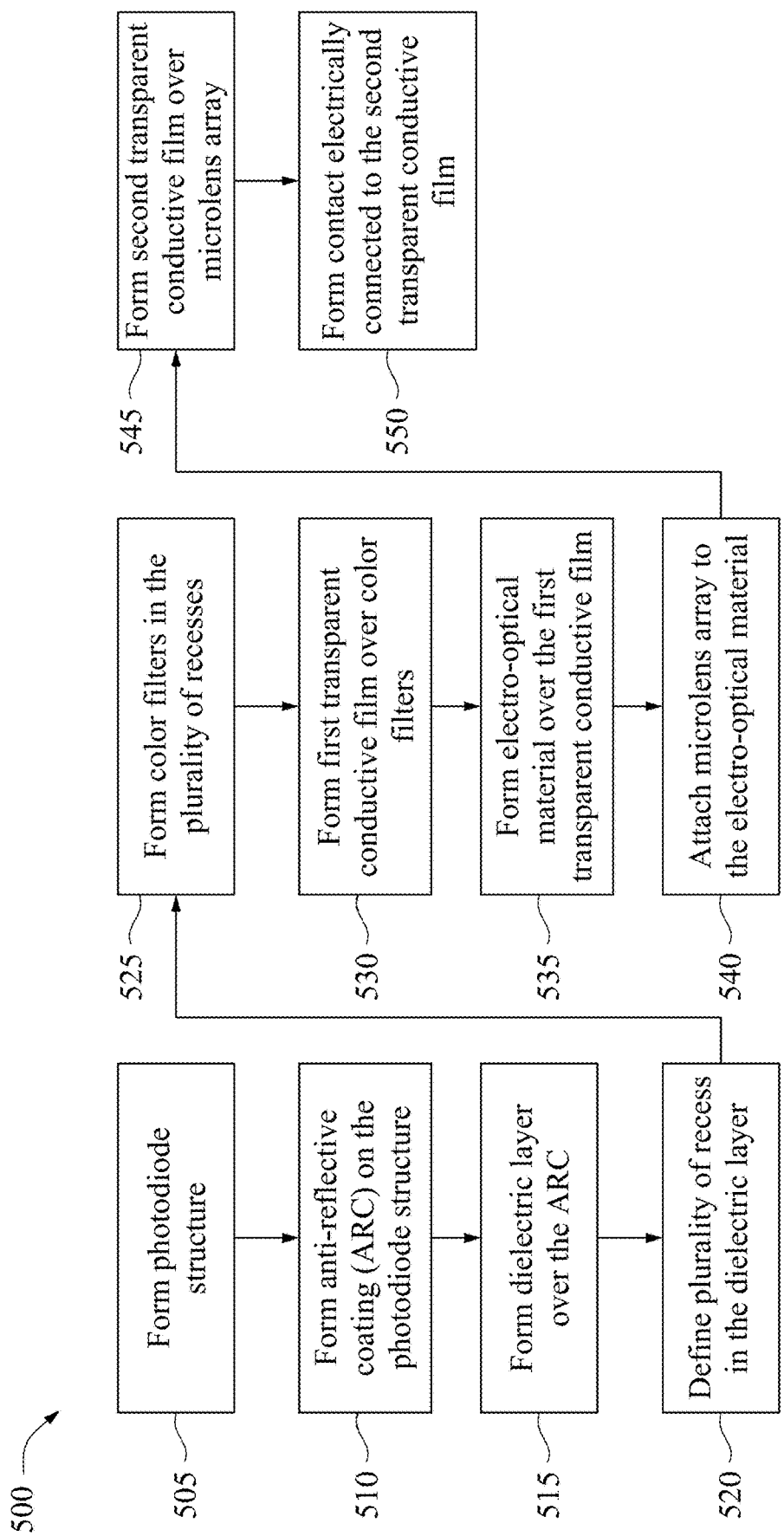
FIG. 5 is a flow chart of a method of making an image sensor in accordance with some embodiments.

FIG. 5 is a flowchart of a method 500 of making an image sensor in accordance with some embodiments. In some embodiments, the method 500 is usable to form the image sensor 100 (FIGS. 1 and 2), the image sensor 100' (FIG. 3) and/or the photodiode 400 (FIG. 4). In operation 505 a photodiode structure is formed. The photodiode structure is formed to convert received light into electrical signals. In some embodiments, the photodiode structure is formed based on the description associated with the photodiode 400 (FIG. 4).

In operation 510, an anti-reflective coating (ARC) is formed on the photodiode structure. In some embodiments, the ARC includes a single low refractive index layer. In some embodiments, the ARC includes multiple layers. In some embodiments, the ARC includes a three-layered structure. In some embodiments, the ARC structure includes a silicon oxide layer, a hafnium oxide ($HfO_2$) layer, and a tantalum oxide ($Ta_2O_5$) layer. In some embodiments, the ARC is formed by CVD or another suitable deposition process.

Figure 6A:
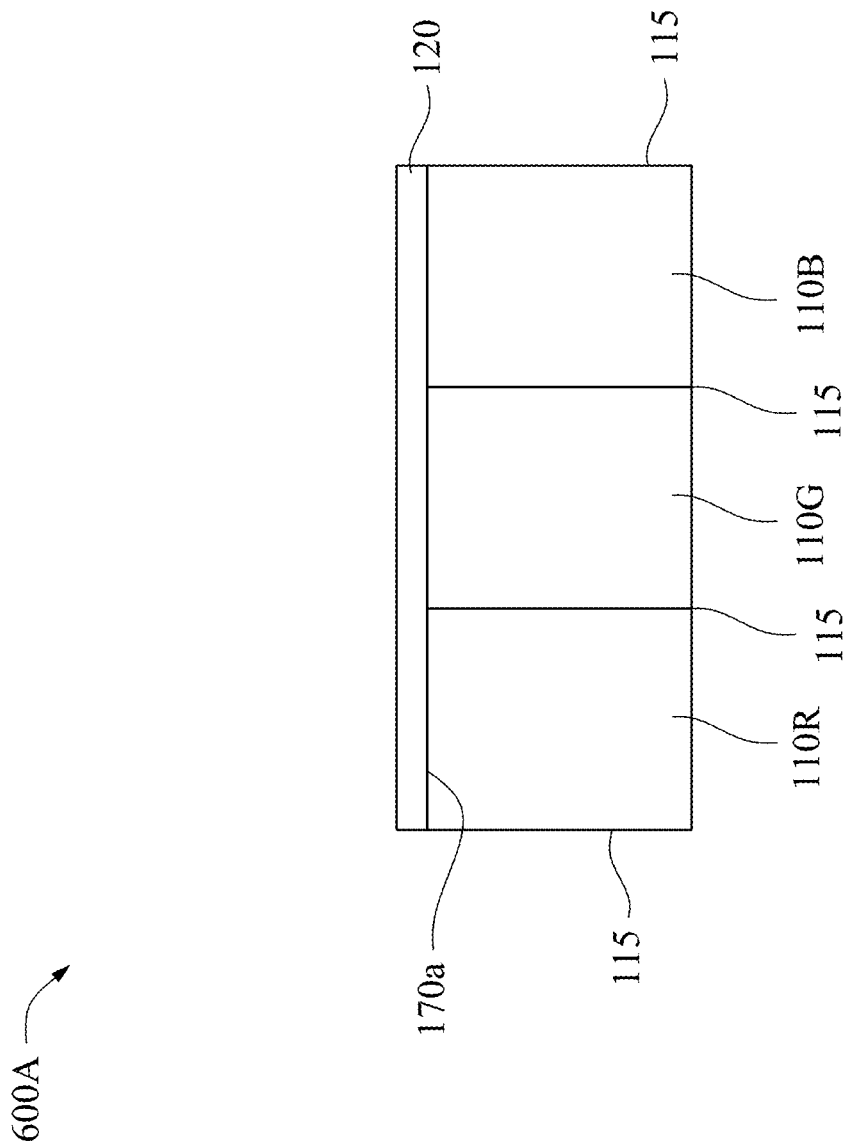
FIGS. 6A-6F are cross-sectional views of an image sensor during intermediate stages of manufacture in accordance with some embodiments.

FIG. 6A is a cross-sectional view of an image sensor 600A following operation 510 in accordance with some embodiments. The image sensor 600A includes the ARC 120 over the photodiodes 110 and the first isolating material 115.

Returning to FIG. 5, in operation 515, a dielectric layer is formed over the ARC. In some embodiments, the dielectric layer includes silicon oxide, silicon nitride or another suitable dielectric material. In some embodiments, the dielectric layer is formed using PECVD. In some embodiments, a thickness of the dielectric layer ranges from about 3,000 Å and about 15,000 Å, such as 8,000 Å. If a thickness of the dielectric layer is too great, material is wasted and processing time is increased, in some instances. If a thickness of the dielectric layer is too small, then a size of the color filters for the image sensor is too small to achieve a high degree of filtering of incident light, in some instances.

Figure 6B:
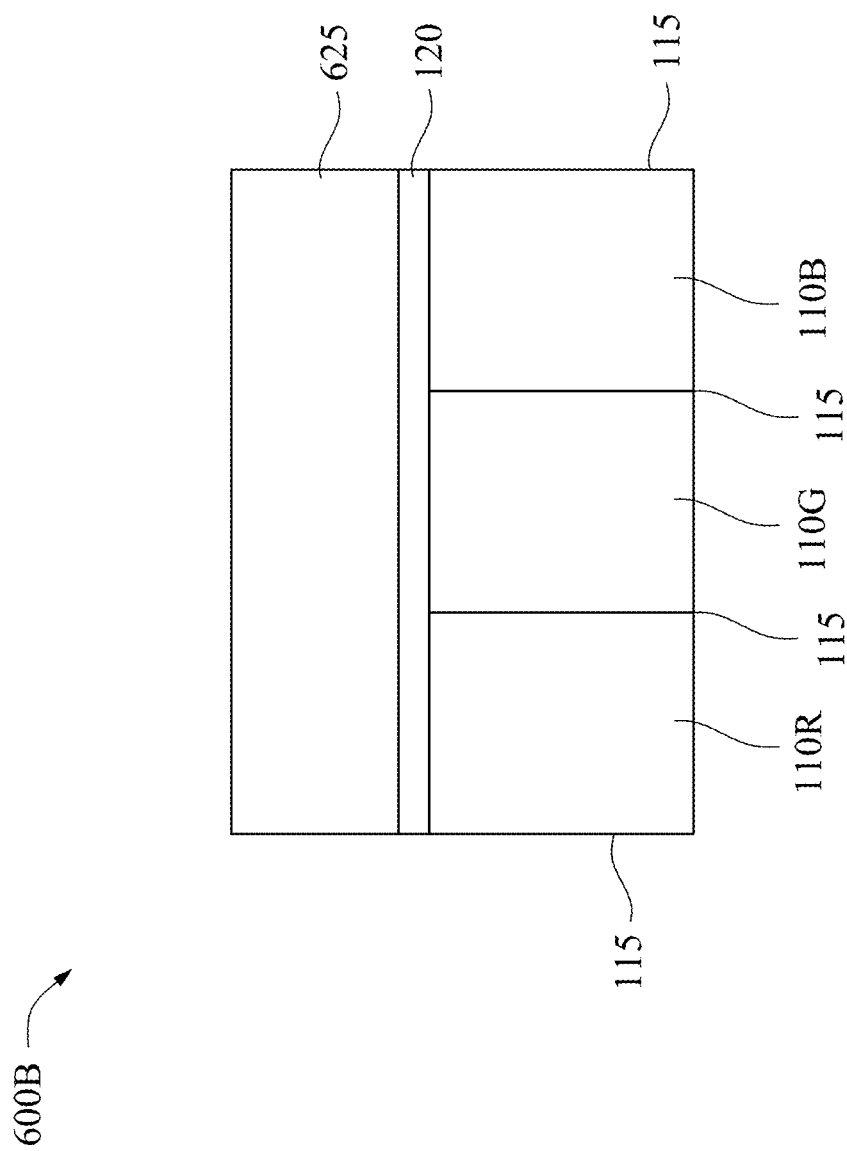

FIG. 6B is a cross-sectional view of an image sensor 600B following operation 515 in accordance with some embodiments. The image sensor 600B includes a dielectric layer 625 over the ARC 120.

Returning to FIG. 5, in operation 520, a plurality of recesses is defined in the dielectric layer. In some embodiments, a hardmask layer is formed over the dielectric layer. In some embodiments, the hardmask layer includes a metal or a high refractive index material, and is formed by any acceptable process, such as using CVD, diffusion, the like, or a combination thereof. In some embodiments, the hardmask layer includes copper, aluminum, tantalum nitride, titanium nitride, tungsten, silicon nitride, other high refractive index material, or a combination thereof. A high refractive index material may have a refractive index greater than 2.0. In some embodiments, the hardmask layer has a thickness ranging from about 100 Å and about 2,000 Å, such as about 1,500 Å. If a thickness of the hardmask layer is too large, then processing becomes more difficult because the aspect ratio of the recesses increase, in some instances. If the thickness of the hardmask layer is too small, then precision in forming the recesses decreases, in some instances. Each of the recesses corresponds to a photodiode of the photodiode structure. In some embodiments, the recesses are formed using an acceptable photolithography and etching process, such a reactive ion etching (RIE), inductively coupled plasma (ICP), capacitively coupled plasma (CCP), sputter etch, the like, or a combination thereof. In some embodiments, the recesses have a depth in the dielectric layer ranging from about 5,000 Å and about 10,000 Å, such as about 7,500 Å. If a depth of the recesses is too great, material is wasted and processing time is increased, in some instances. If a depth of the recesses is too small, then a size of the color filters for the image sensor is too small to achieve a high degree of filtering of incident light, in some instances.

Figure 6C:
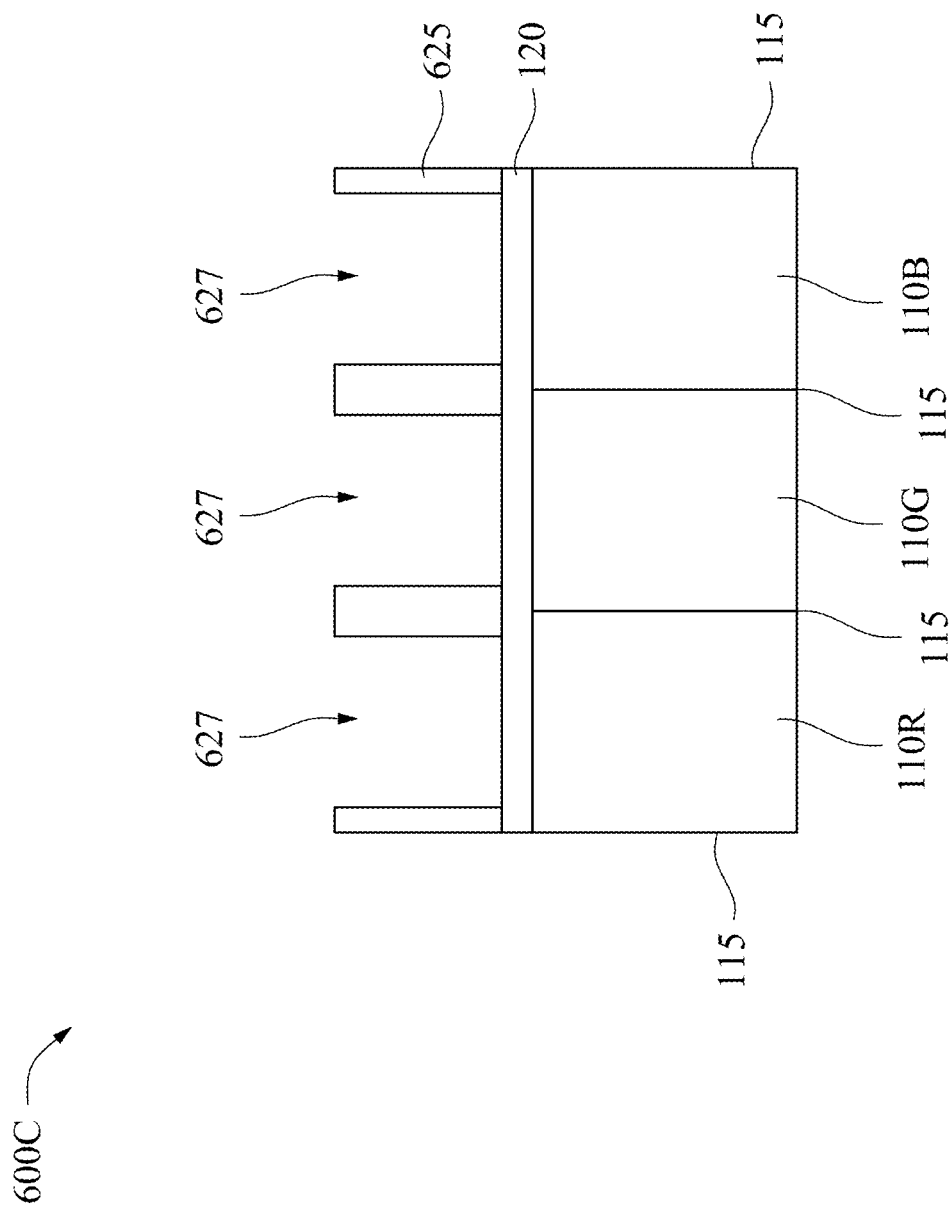

FIG. 6C is a cross-sectional view of an image sensor 600C following operation 520 in accordance with some embodiments. The image sensor 600C includes a plurality of recesses 627 in the dielectric layer 625. The recesses 627 extend through the entirety of the dielectric layer 625 and expose underlying portions of the ARC 120.

Returning to FIG. 5, in operation 525, color filters are formed in the plurality of recesses. Formation of the color filters includes forming color filters configured to filter different wavelengths of light in difference recesses. A pattern of the color filters is determined based on a design of the image sensor. In some embodiments, the color filters form a Bayer pattern. In some embodiments, the color filters include a polymeric material or resin, such as a polymeric polymer, polymethyl-methacrylate (PMMA), polyglycidylmethacrylate (PGMS), or the like, that includes colored pigments.

In some embodiments, a polymer material with a first color pigment, e.g., a red pigment, is to be formed in all of the recesses using a process such as spin coating or the like. The polymeric polymer material with the first color pigment in recesses that do not correspond to the color in the design of the image sensor is removed by using a suitable photolithographic masking and etching process, such as an anisotropic etch. Next, a polymer material with a second color pigment, e.g., a green pigment, is formed in all of the recesses exposed by the removal of the polymer material with the first color pigment. The process is then repeated until all of the recesses are filled with a color filter corresponding to the design of the image sensor.

In operation 530, a first transparent conductive film is formed over the color filters. In some embodiments, the first transparent conductive film includes indium tin oxide (ITO), indium zinc oxide (IZO), indium gallium zinc oxide (IGZO), and the like. In some embodiments, the first transparent conductive film is deposited by physical vapor deposition (PVD). However, other deposition processes, such as chemical vapor deposition (CVD) or atomic layer deposition (ALD), or other applicable processes, are possible. In some embodiments, a thickness of the first transparent conductive film ranges from about 50 nm to about 300 nm. If a thickness of the bottom layer of transparent conductive material 140*b* is too large, then more light is absorbed while passing through the bottom layer of transparent conductive material 140*b*, in some instances. If the thickness of the bottom layer of transparent conductive material 140*b* is too small, then a resistance within the layer increases to an unacceptable level, in some instances. In some embodiments, the first transparent conductive film is deposited as a blanket deposition. In some embodiments, the first transparent conductive film is patterned following deposition to define portions of the first transparent conductive film over corresponding photodiodes of the image sensor.

Figure 6D:
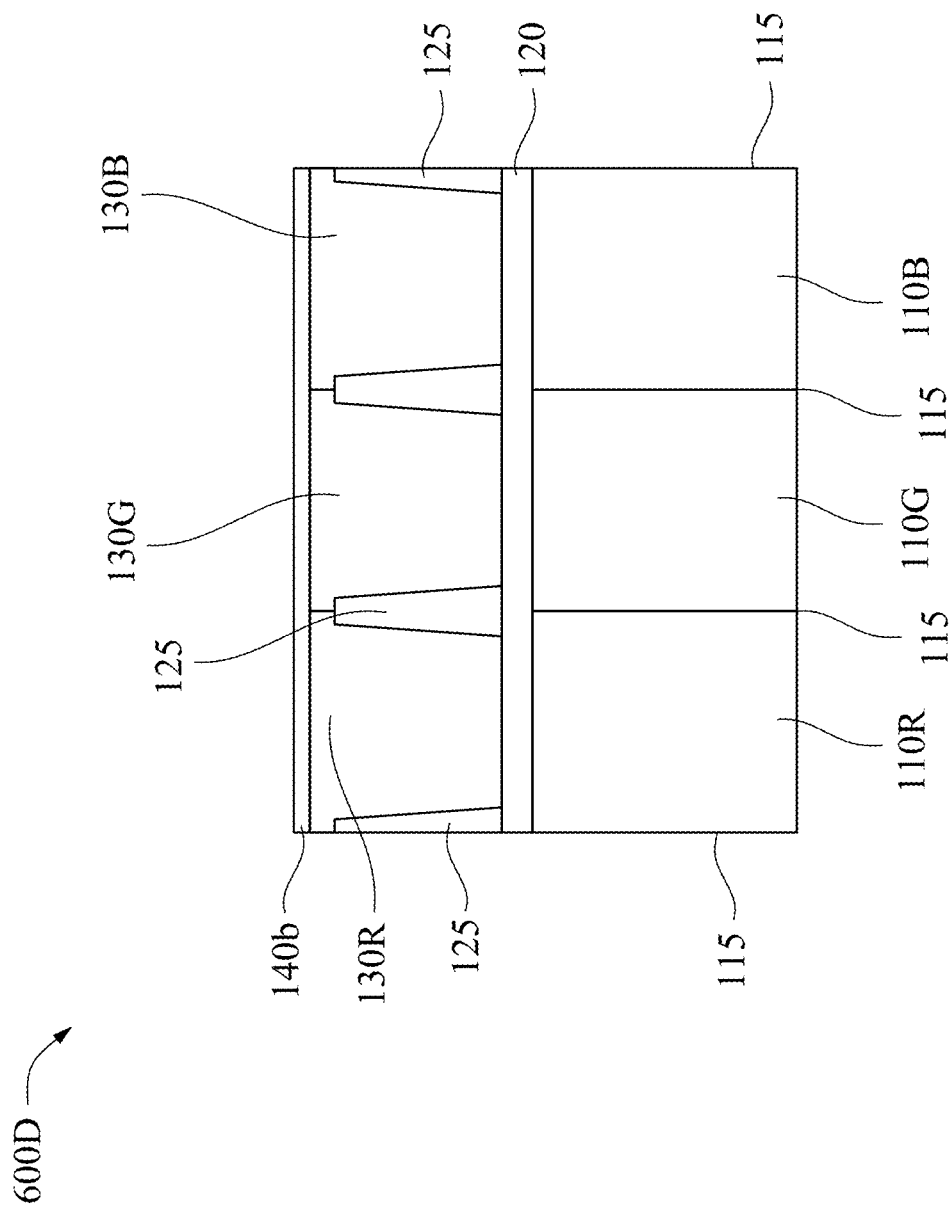

FIG. 6D is a cross-sectional view of an image sensor 600D following operation 530 in accordance with some embodiments. The image sensor 600C includes the color filters 130 in the plurality of recesses 627 in the dielectric layer 625. The bottom layer of transparent conductive material 140*b* is over the color filters 130.

Returning to FIG. 5, in operation 535 an electro optical (EO) material is formed over the first transparent conductive film. In some embodiments, the EO material is formed using PVD, CVD, ALD or another suitable formation process. In some embodiments, a combination of lithography and etching processes are performed on the EO material in order to physically separate the EO material for each pixel from the EO material associated with adjacent pixels. In some embodiments, the EO material includes at least one of gallium arsenide (GaAs), strained silicon (Si), cadmium telluride (CdTe), zinc oxide (ZnO), potassium dihydrogen phosphate (KDP), lanthanum tantalate (LaTaO$_3$), lithium niobate (LiNbO$_3$), lead zirconate titanate (PZT), barium titanate (BaTiO$_3$), strontium titanate (SrTiO$_3$), strontium barium niobate (Sr$_x$Ba$_y$Nb$_2$O$_6$), potassium niobate (KNbO$_3$), lead lanthanum zirconate titanate (PLZT), barium titanate (BaTiO$_3$), potassium titanate niobate (KTN), polymers or another suitable material. In some embodiments, a thickness of the EO material ranges from about 0.5 µm to about 1 µm. If a thickness of the EO material is too large, too much light is absorbed while passing through the EO material, in some instances. If the thickness of the EO material is too small, an effect on refracting the light incident on the EO material is insufficient to achieve adjusting of the focal point location, in some instances.

Figure 6E:
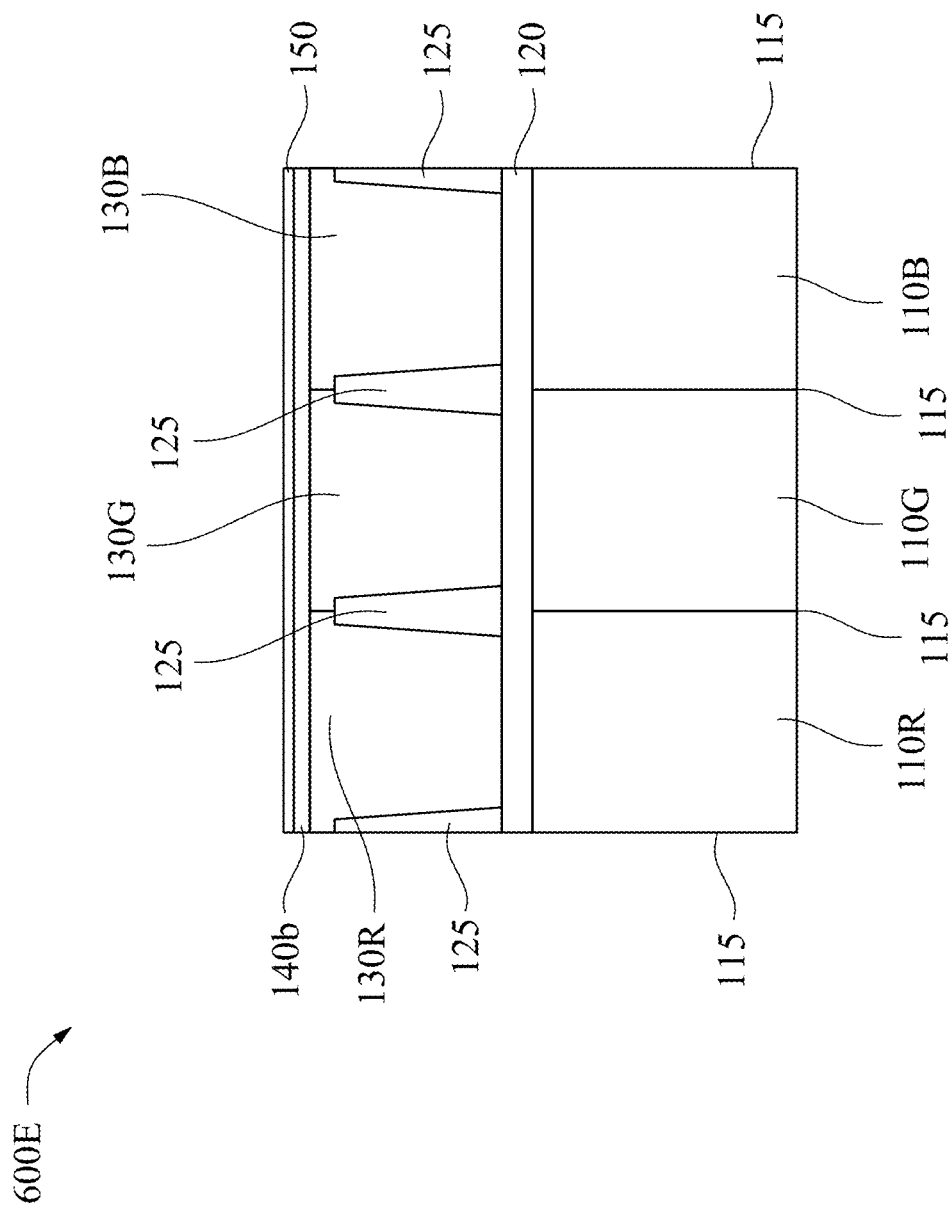

FIG. 6E is a cross-sectional view of an image sensor 600E following operation 535 in accordance with some embodiments. The image sensor 600E includes the EO film 150 over the bottom layer of transparent conductive material 140b.

Returning to FIG. 5, in operation 540 an array of microlenses is attached to the EO material. In some embodiments, the microlenses are formed of any material that may be patterned and formed into lenses, such as a high transmittance, acrylic polymer. In some embodiments, the microlenses formed using a material in a liquid state and spin-on techniques to produce a substantially planar surface having a substantially uniform thickness. In some embodiments, deposition techniques like CVD, PVD, or the like, are used to form a planar surface. The planar material for the microlens layer is patterned using a photolithography and etch technique to pattern the planar material in an array corresponding to the pixels of the image sensor. The planar material is then reflowed to form an appropriate curved surface for the microlenses. The microlenses are then cured using a UV treatment to harden the microlens material.

Figure 6F:
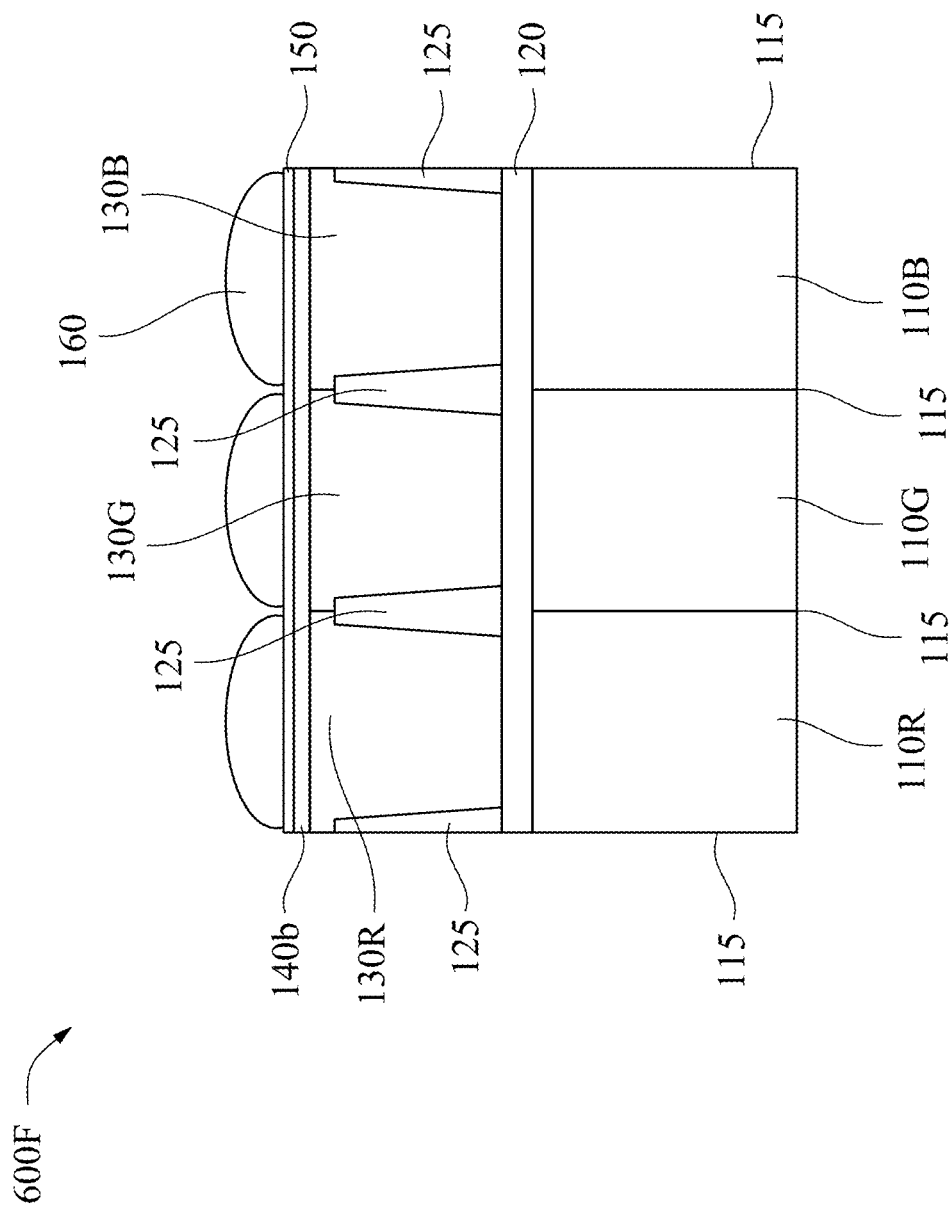

FIG. 6F is a cross-sectional view of an image sensor 600F following operation 540 in accordance with some embodiments. The image sensor 600F includes the microlenses 160 over the EO film 150.

Returning to FIG. 5, in operation 545, a second transparent conductive film is formed over the microlens array. The second transparent conductive film fills in spaces between adjacent microlenses in order to electrically connect to the first transparent conductive film. In some embodiments, the second transparent conductive film includes a same material as the first transparent conductive film. In some embodiments, the second transparent conductive film includes a different material from the first transparent conductive film. In some embodiments, the second transparent conductive film is formed using a same deposition process as the first transparent conductive film. In some embodiments, the second transparent conductive film is formed using a different deposition process from the first transparent conductive film. In some embodiments, following operation 540, the image sensor resembles the image sensor 100 (FIG. 1).

In operation 550, a contact is formed on the second transparent conductive film. The contact electrically connects to the second transparent conductive film. In some embodiments, the contact is formed as part of an interconnect structure. In some embodiments, the contact is formed by CVD, PVD, ALD or another suitable process. In some embodiments, a single contact is formed over the second transparent conductive film. In some embodiments, multiple contacts are formed over the second transparent conductive film. In some embodiments, one contact is formed for each pixel of the image sensor. In some embodiments, more than one contact is formed for at least one pixel of the image sensor.

In some embodiments, additional operations are included in the method 500. For example, in some embodiments, the method 500 includes electrically connecting the contact to a controller. In some embodiments, at least one operation of the method 500 is omitted. For example, in some embodiments where the image sensor is an FSI, the operation 515 is omitted. In some embodiments, an order of operation of the method 500 is adjusted. For example, in some embodiments, the operations 515 and 520 are performed prior to the operation 510.

Figure 7:
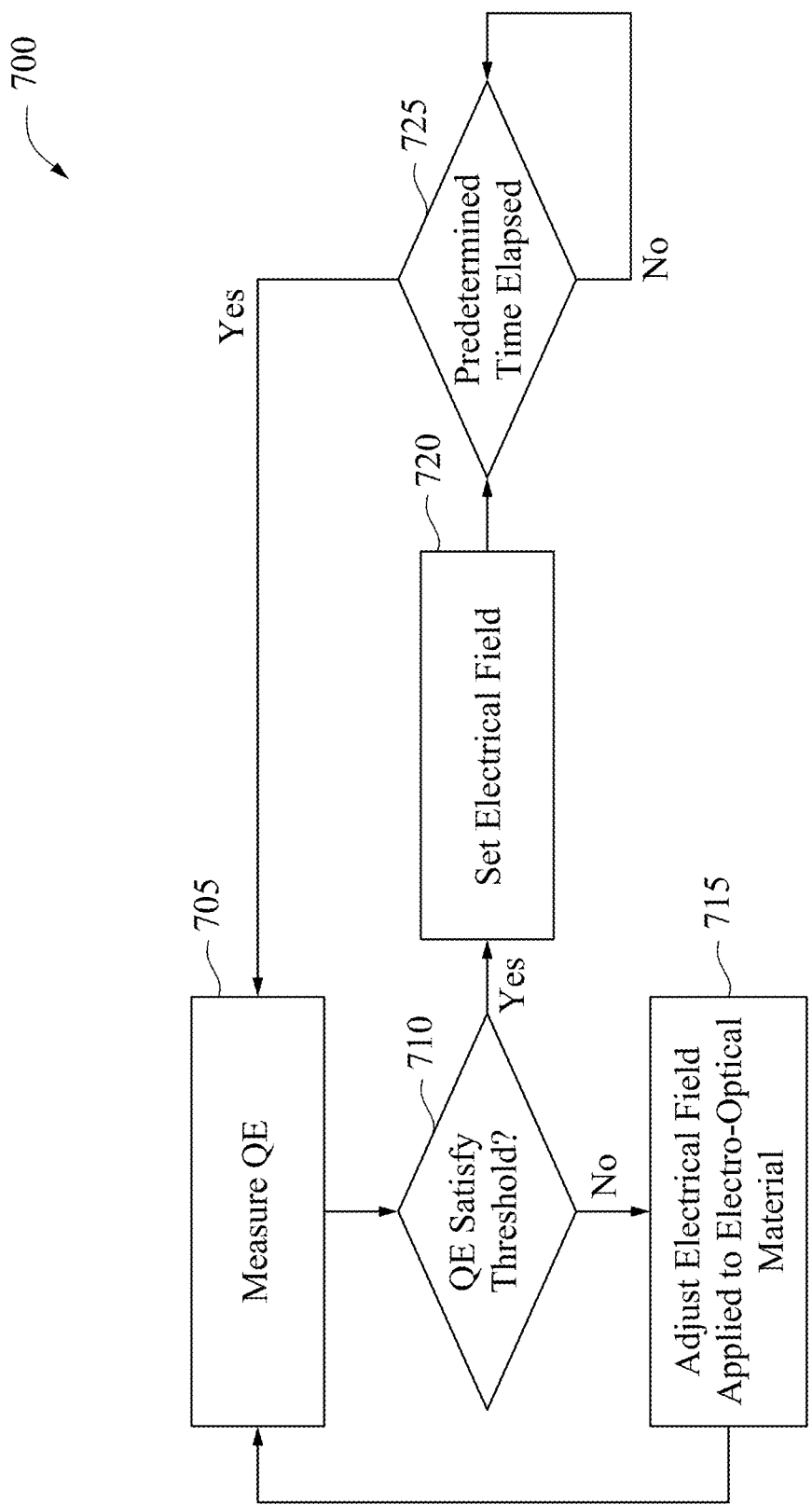
FIG. 7 is a flow chart of a method of using an image sensor in accordance with some embodiments.

FIG. 7 is a flow chart of a method 700 of operation an image sensor in accordance with some embodiments. The method 700 is usable to operate the image sensor 100 (FIGS. 1 and 2) and/or the image sensor 100' (FIG. 3). In operation 705, a QE of a pixel is measured. The QE is measured by determining an amount of light incident on the pixel and detected an electrical signal generated by the light incident on the pixel. In some embodiments, the QE is determined by measuring an electrical current at the photodiode of the pixel and an amount of light incident on the pixel from outside of the pixel. Based on these two values, a QE is able to be determined.

In operation 710 the QE is compared with a QE threshold value. In some embodiments, the QE threshold value is determined based on a user input. In some embodiments, the QE threshold value is determined based performance criteria of the image sensor. In response to a determination that the QE satisfies the QE threshold value, the method 700 proceeds to operation 720. In response to a determination that the QE fails to satisfy the QE threshold value, the method 700 proceeds to operation 715.

In operation 715, the electrical field applied to the EO material of the pixel is adjusted. The electrical field is adjusted by altering a voltage applied to the transparent conductive film associated with the pixel. In some embodiments, the electrical field is increased. In some embodiments, the electrical field is decrease. In some embodiments, empirical information for other pixels of a same color is used to adjust the electrical field.

Following operation 715, the method 700 returns to operation 705. In some embodiments, following a predetermined number of iterations of operations 705-715, without performing operation 720, a notice is transmitted to a user that an electrical field to produce a suitable QE was not found. In some embodiments, the notice requests a user input. In some embodiments, the notice is transmitted via a wired or wireless network. In some embodiments, the notice includes an audio or a visual notice.

In operation 720, the electrical field for the EO material of the pixel is set. A controller maintains the voltage applied to the transparent conductive material during operation of the image sensor.

In operation 725, a determination is made regarding whether a predetermined time has elapsed. The predetermined time corresponds to a duration of operation of the pixel having the EO at the electrical field set in operation 720. In some embodiments, the predetermined time is set based on a user input. In some embodiments, the predetermined time is set based on empirical data for other image sensors. In response to a determination that the predetermined time has not elapsed, the method 700 continues to perform operation 725. In response to a determination that the predetermined time has elapsed, the method 700 returns to operation 705 to help ensure that the pixel continues to perform at a high QE value.

In some embodiments, additional operations are included in the method 700. For examples, in some embodiments, in response to a low power state of the image sensor, the electrical field applied to the EO material is removed until a sufficient state of charge is restored. In some embodiments, at least one operation of method 700 is omitted. For example, in some embodiments, the operation 725 is omitted. In some embodiments, an order of operations of the method 700 is changed. For example, in some embodiments, the operation 720 is performed prior to operation 705 for an initial setting of the pixel.

Figure 8:
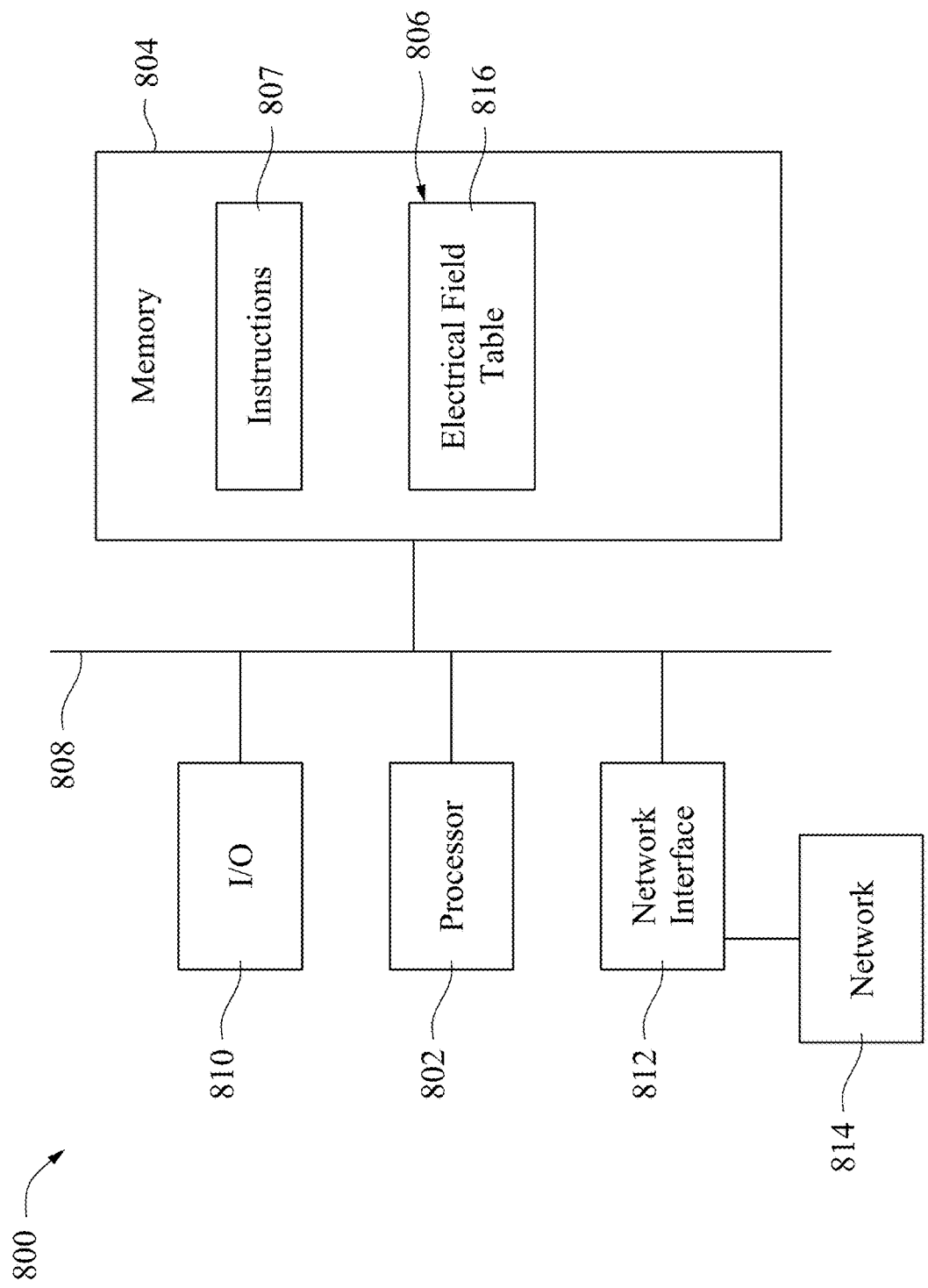
FIG. 8 is a block diagram of a controller for controlling an image sensor in accordance with some embodiments.

FIG. 8 is a block diagram of a controller 800 for controlling an image sensor in accordance with some embodiments. Controller 800 includes a hardware processor 802 and a non-transitory, computer readable storage medium 804 encoded with, i.e., storing, the computer program code 806, i.e., a set of executable instructions. Computer readable storage medium 804 is also encoded with instructions 807 for interfacing with an image sensor. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause controller 800 to be usable for performing a portion or all of the operations as described in method 700.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random-access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause controller 800 to perform method 700. In some embodiments, the storage medium 804 also stores information needed for performing a method 700 as well as information generated during performing the method 700, such as an electric field table parameter 816 including the electrical field to be applied to each pixel of the image sensor and/or a set of executable instructions to perform the operation of method 700.

In some embodiments, the storage medium 804 stores instructions 807 for interfacing with the image sensor. The instructions 807 enable processor 802 to generate instructions readable by the image sensor to effectively implement method 700.

Controller 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

Controller 800 also includes network interface 812 coupled to the processor 802. Network interface 812 allows controller 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-1394. In some embodiments, method 500 or 700 is implemented in two or more controllers 800, and information such as memory type, memory array layout, I/O voltage, I/O pin location and charge pump are exchanged between different controllers 800 via network 814.

An aspect of this description relates to an image sensor. The image sensor includes a first photodiode and a second photodiode. The image sensor further includes a first color filter over the first photodiode, wherein the first color filter is configured to pass a first wavelength of light. The image sensor further includes a second color filter over the second photodiode, wherein the second color filter is configured to pass a second wavelength of light different from the first wavelength. The image sensor further includes a first microlens over the first color filter and a second microlens over the second color filter. The image sensor further includes a first electro-optical (EO) film between the first color filter and the first microlens, wherein a material of the first EO film is configured to change refractive index in response to application of an electrical field. The image sensor further includes a second EO film between the second color filter and the second microlens, wherein a material of the second EO film is configured to change refractive index in response to application of an electrical field. In some embodiments, the image sensor further includes a first transparent conductive layer surrounding the first EO film. In some embodiments, the image sensor further includes a second transparent conductive film over the first microlens; and a pillar of transparent conductive material, wherein the second transparent conductive film is electrically connected to the first transparent conductive layer by the pillar of transparent conductive material. In some embodiments, the image sensor further includes a contact electrically connected to the second transparent conductive film. In some embodiments, the second transparent conductive film extends over the second microlens. In some embodiments, the image sensor further includes a third transparent conductive film over the second microlens, wherein the third transparent conductive film is electrically separated from the second transparent conductive film. In some embodiments, the image sensor further includes a first contact electrically connected to the second transparent conductive film; and a second contact electrically connected to the third transparent conductive film. In some embodiments, the image sensor further includes a plurality of contacts electrically connected to the second transparent conductive film. In some embodiments, the first EO film is physically separated from the second EO film. In some embodiments, the first EO film includes at least one of gallium arsenide (GaAs), strained silicon (Si), cadmium telluride (CdTe), zinc oxide (ZnO), potassium dihydrogen phosphate (KDP), lanthanum tantalate ($LaTaO_3$), lithium niobate ($LiNbO_3$), lead zirconate titanate (PZT), barium titanate ($BaTiO_3$), strontium titanate ($SrTiO_3$), strontium barium niobate ($Sr_xBa_yNb_2O_6$), potassium niobate (KNbO$_3$), lead lanthanum zirconate titanate (PLZT), barium titanate (BaTiO$_3$), potassium titanate niobate (KTN), or a polymer.

An aspect of this description relates to an image sensor. The image sensor includes a plurality of pixels. Each of the plurality of pixels includes a photodiode; a color filter over the photodiode; and a first transparent conductive film over the color filter. Each of the plurality of pixels further includes an electro-optical (EO) film over the first transparent conductive film, wherein a material of the EO film is configured to change refractive index in response to application of an electrical field. Each of the plurality of pixels further includes a microlens over the EO film; a second transparent conductive layer over the microlens; and a pillar of transparent conductive material electrically connecting the first transparent conductive layer and the second transparent conductive layer. In some embodiments, each of the plurality of pixels further includes an anti-reflective coating between the color filter and the photodiode. In some embodiments, the image sensor further includes a contact electrically connected to the second transparent conductive material. In some embodiments, the second transparent conductive material extends continuously over the microlens for each of the plurality of pixels. In some embodiments, a second transparent conductive film in a first pixel of the plurality of pixels is electrically separated from a second transparent conductive film in a second pixel of the plurality of pixels. In some embodiments, the image sensor further includes a plurality of contacts, wherein each contact of the plurality of contacts is electrically connected to a corresponding second transparent conductive film of a corresponding pixel of the plurality of pixels. In some embodiments, the EO film includes at least one of gallium arsenide (GaAs), strained silicon (Si), cadmium telluride (CdTe), zinc oxide (ZnO), potassium dihydrogen phosphate (KDP), lanthanum tantalate (LaTaO$_3$), lithium niobate (LiNbO$_3$), lead zirconate titanate (PZT), barium titanate (BaTiO$_3$), strontium titanate (SrTiO$_3$), strontium barium niobate (Sr$_x$Ba$_y$Nb$_2$O$_6$), potassium niobate (KNbO$_3$), lead lanthanum zirconate titanate (PLZT), barium titanate (BaTiO$_3$), potassium titanate niobate (KTN), or a polymer.

An aspect of this description relates to a method of making an image sensor. The method includes forming a photodiode structure. The method further includes forming a color filter over the photodiode structure. The method further includes forming a first transparent conductive layer over the color filter. The method further includes forming an electro-optical (EO) film over the first transparent conductive layer, wherein a material of the EO film is configured to change refractive index in response to application of an electrical field. The method further includes forming a microlens over the EO film. The method further includes forming a second transparent conductive layer over the microlens, wherein the second transparent conductive layer is electrically connected to the first transparent conductive layer. In some embodiments, the method further includes forming a contact electrically connected to the second transparent conductive layer. In some embodiments, forming the EO film includes forming the EO film including at least one of gallium arsenide (GaAs), strained silicon (Si), cadmium telluride (CdTe), zinc oxide (ZnO), potassium dihydrogen phosphate (KDP), lanthanum tantalate (LaTaO$_3$), lithium niobate (LiNbO$_3$), lead zirconate titanate (PZT), barium titanate (BaTiO$_3$), strontium titanate (SrTiO$_3$), strontium barium niobate (Sr$_x$Ba$_y$Nb$_2$O$_6$), potassium niobate (KNbO$_3$), lead lanthanum zirconate titanate (PLZT), barium titanate (BaTiO$_3$), potassium titanate niobate (KTN), or a polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
 a first photodiode;
 a second photodiode;
 a first color filter over the first photodiode, wherein the first color filter is configured to pass a first wavelength of light;
 a second color filter over the second photodiode, wherein the second color filter is configured to pass a second wavelength of light different from the first wavelength;
 a first microlens over the first color filter;
 a second microlens over the second color filter;
 a first electro-optical (EO) film between the first color filter and the first microlens, wherein a material of the first EO film is configured to change refractive index in response to application of a first electrical field; and
 a second EO film between the second color filter and the second microlens, wherein a material of the second EO film is configured to change refractive index in response to application of a second electrical field.

2. The image sensor of claim 1, further comprising a first transparent conductive layer surrounding the first EO film.

3. The image sensor of claim 2, further comprising:
 a second transparent conductive film over the first microlens; and
 a pillar of transparent conductive material, wherein the second transparent conductive film is electrically connected to the first transparent conductive layer by the pillar of transparent conductive material.

4. The image sensor of claim 3, further comprising a contact electrically connected to the second transparent conductive film.

5. The image sensor of claim 4, wherein the second transparent conductive film extends over the second microlens.

6. The image sensor of claim 3, further comprising a third transparent conductive film over the second microlens, wherein the third transparent conductive film is electrically separated from the second transparent conductive film.

7. The image sensor of claim 6, further comprising:
 a first contact electrically connected to the second transparent conductive film; and
 a second contact electrically connected to the third transparent conductive film.

8. The image sensor of claim 3, further comprising a plurality of contacts electrically connected to the second transparent conductive film.

9. The image sensor of claim 1, wherein the first EO film is physically separated from the second EO film.

10. The image sensor of claim 1, wherein the EO film comprises at least one of gallium arsenide (GaAs), strained silicon (Si), cadmium telluride (CdTe), zinc oxide (ZnO), potassium dihydrogen phosphate (KDP), lanthanum tantalate (LaTaO$_3$), lithium niobate (LiNbO$_3$), lead zirconate titanate (PZT), barium titanate (BaTiO$_3$), strontium titanate (SrTiO$_3$), strontium barium niobate (Sr$_x$Ba$_y$Nb$_2$O$_6$), potassium niobate (KNbO$_3$), lead lanthanum zirconate titanate (PLZT), barium titanate (BaTiO$_3$), potassium titanate niobate (KTN), or a polymer.

11. An image sensor comprising:
 a plurality of pixels, wherein each of the plurality of pixels comprises:
  a photodiode;
  a color filter over the photodiode;
  a first transparent conductive layer over the color filter;
  an electro-optical (EO) film over the first transparent conductive layer, wherein a material of the EO film is configured to change refractive index in response to application of an electrical field;
  a microlens over the EO film;
  a second transparent conductive layer over the microlens; and
  a pillar of transparent conductive material electrically connecting the first transparent conductive layer and the second transparent conductive layer.

12. The image sensor of claim 11, wherein each of the plurality of pixels further comprises an anti-reflective coating between the color filter and the photodiode.

13. The image sensor of claim 11, further comprising a contact electrically connected to the second transparent conductive layer.

14. The image sensor of claim 11, wherein the second transparent conductive layer extends continuously over the microlens for each of the plurality of pixels.

15. The image sensor of claim 11, wherein a second transparent conductive film in a first pixel of the plurality of pixels is electrically separated from a second transparent conductive film in a second pixel of the plurality of pixels.

16. The image sensor of claim 11, further comprising a plurality of contacts, wherein each contact of the plurality of contacts is electrically connected to a corresponding second transparent conductive film of a corresponding pixel of the plurality of pixels.

17. The image sensor of claim 11, wherein the first EO film comprises at least one of gallium arsenide (GaAs), strained silicon (Si), cadmium telluride (CdTe), zinc oxide (ZnO), potassium dihydrogen phosphate (KDP), lanthanum tantalate (LaTaO$_3$), lithium niobate (LiNbO$_3$), lead zirconate titanate (PZT), barium titanate (BaTiO$_3$), strontium titanate (SrTiO$_3$), strontium barium niobate (Sr$_x$Ba$_y$Nb$_2$O$_6$), potassium niobate (KNbO$_3$), lead lanthanum zirconate titanate (PLZT), barium titanate (BaTiO$_3$), potassium titanate niobate (KTN), or a polymer.

18. A method of making an image sensor, the method comprising:
 forming a photodiode structure;
 forming a color filter over the photodiode structure;
 forming a first transparent conductive layer over the color filter;
 forming an electro-optical (EO) film over the first transparent conductive layer, wherein a material of the EO film is configured to change refractive index in response to application of an electrical field;
 forming a microlens over the EO film; and
 forming a second transparent conductive layer over the microlens, wherein the second transparent conductive layer is electrically connected to the first transparent conductive layer.

19. The method of claim 18, further comprising forming a contact electrically connected to the second transparent conductive layer.

20. The method of claim 18, wherein forming the EO film comprises forming the EO film comprising at least one of gallium arsenide (GaAs), strained silicon (Si), cadmium telluride (CdTe), zinc oxide (ZnO), potassium dihydrogen phosphate (KDP), lanthanum tantalate (LaTaO$_3$), lithium niobate (LiNbO$_3$), lead zirconate titanate (PZT), barium titanate (BaTiO$_3$), strontium titanate (SrTiO$_3$), strontium barium niobate (Sr$_x$Ba$_y$Nb$_2$O$_6$), potassium niobate (KNbO$_3$), lead lanthanum zirconate titanate (PLZT), barium titanate (BaTiO$_3$), potassium titanate niobate (KTN), or a polymer.

* * * * *